(12) United States Patent
Rottner et al.

(10) Patent No.: US 11,984,534 B2
(45) Date of Patent: May 14, 2024

(54) PROCESS FOR PRODUCING A SEMICONDUCTOR COMPONENT BASED ON A III-N COMPOUND

(71) Applicant: Commissariat à l'Energie Atomique et aux Energies Alternatives, Paris (FR)

(72) Inventors: Jean Rottner, Grenoble (FR); Helge Haas, Grenoble (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 404 days.

(21) Appl. No.: 17/309,710

(22) PCT Filed: Dec. 18, 2019

(86) PCT No.: PCT/FR2019/053174
§ 371 (c)(1),
(2) Date: Jun. 16, 2021

(87) PCT Pub. No.: WO2020/128339
PCT Pub. Date: Jun. 25, 2020

(65) Prior Publication Data
US 2022/0037560 A1 Feb. 3, 2022

(30) Foreign Application Priority Data
Dec. 20, 2018 (FR) ......................................... 1873668

(51) Int. Cl.
*H01L 29/00* (2006.01)
*H01L 21/02* (2006.01)
(Continued)

(52) U.S. Cl.
CPC .......... *H01L 33/32* (2013.01); *H01L 21/0206* (2013.01); *H01L 29/2003* (2013.01); *H01L 33/0075* (2013.01); *H01L 33/0095* (2013.01)

(58) Field of Classification Search
CPC ............. H01L 29/2003; H01L 21/0206; H01L 33/0075
See application file for complete search history.

(56) References Cited

U.S. PATENT DOCUMENTS

2009/0184337 A1 7/2009 Fan et al.
2013/0161705 A1 6/2013 Disney et al.
(Continued)

FOREIGN PATENT DOCUMENTS

EP     2642533 A2    9/2013

OTHER PUBLICATIONS

Translation of the Written Opinion of the International Search Authority for International Application No. PCT/FR2019/053174, 5 pages.

(Continued)

*Primary Examiner* — Reema Patel
(74) *Attorney, Agent, or Firm* — Jordan IP Law, LLC

(57) ABSTRACT

The present description concerns a method of manufacturing a semiconductor component (170), including the successive steps of: providing a stack including a first semiconductor layer (105) made of a III-N compound and a second conductive layer (107) coating the first layer; forming a trench (110) crossing the second layer (107) and stopping on the first layer (105), said trench laterally delimiting a contact metallization in the second layer (107); forming in said trench (110) a metal spacer (111) made of a material different from that of the second layer (107), in contact with the sides (Continued)

of the contact metallization; and continuing said trench (110) through at least a portion of the thickness of the first layer (105).

9 Claims, 3 Drawing Sheets

(51) Int. Cl.
*H01L 29/20* (2006.01)
*H01L 33/00* (2010.01)
*H01L 33/32* (2010.01)

(56) References Cited

U.S. PATENT DOCUMENTS

2016/0322538 A1 11/2016 Einfeldt et al.
2017/0288050 A1 10/2017 Ueno et al.
2017/0309676 A1* 10/2017 Odnoblyudov ..... H01L 27/1203
2017/0309713 A1 10/2017 Hirler et al.

OTHER PUBLICATIONS

International Search Report for International Application No. PCT/FR2019/053174 dated Feb. 25, 2020, 2 pages.
Translation of the Written Opinion of the International Search Authority for International Application No. PCT/FR2019/053175 dated Mar. 3, 2020, 5 pages.
International Search Report for International Application No. PCT/FR2019/053175 dated Mar. 3, 2020, 2 pages.

* cited by examiner

PROCESS FOR PRODUCING A SEMICONDUCTOR COMPONENT BASED ON A III-N COMPOUND

FIELD

The present disclosure generally concerns the field of semiconductor components, and more particularly aims at a method of manufacturing a semiconductor component based on a III-N compound, as well as a component formed by this method.

BACKGROUND

Many structures of semiconductor components based on one or a plurality of III-N compounds, for example, light-emitting diodes, photosensitive diodes, power diodes, power transistors, etc. have already been provided.

The manufacturing of such components however raises issues, particularly linked to the etching of the III-N compounds and to the forming of the connection metallizations in contact with the III-N compounds.

SUMMARY

An embodiment provides a semiconductor component manufacturing method, comprising the successive steps of:
- a) forming a stack comprising a first semiconductor layer made of a III-N compound, a second conductive layer coating the first layer, and a third hard mask layer coating the second layer;
- b) forming a trench crossing the third and second layers and stopping on the first layer, said trench laterally delimiting a contact metallization in the second layer;
- c) forming in said trench a metal spacer made of a material different from that of the second layer, in contact with the sides of the third and second layers; and
- d) continuing said trench through at least a portion of the thickness of the first layer.

According to an embodiment, step c) comprises:
- a step of deposition of a metal layer made of said material different from that of the second layer, on the upper surface of the third layer and on the lateral walls and at the bottom of said trench; and
- a step of vertical anisotropic etching of the metal layer, at the end of which only the vertical portions of the metal layer coating the lateral walls of said trench are kept.

According to an embodiment, the method further comprises, after step d), a step of chemical cleaning of the exposed surfaces of the first layer within the trench.

According to an embodiment, the step of chemical cleaning is carried out by means of a solution based on potassium hydroxide or of a solution based on tetramethylammonium hydroxide, or of a solution based on tetraethylammonium hydroxide.

According to an embodiment, the second layer comprises aluminum or silver.

According to an embodiment, the spacers are made of a metal from the group comprising platinum, nickel, and tungsten.

According to an embodiment, the etching implemented at step d) is a dry etching.

According to an embodiment, the method further comprises, between step a) and step b), a step of annealing the second layer at a temperature in the range from 200° C. to 900° C.

According to an embodiment, the stack further comprises, on the side of the first layer opposite to the second layer, a third layer of a III-N compound different from that of the first layer, and the etching implemented at step d) thoroughly crosses the first layer and at least a portion of the thickness of the third layer.

According to an embodiment, the stack further comprises, on the side of the third layer opposite to the first layer, a fourth layer of a III-N compound different from that of the third layer, and the etching implemented at step d) thoroughly crosses the third layer and at least a portion of the thickness of the fourth layer.

Another embodiment provides a semiconductor component comprising:
- a stack comprising a first semiconductor layer made of a III-N compound, a second conductive layer coating the first layer, and a third hard mask layer coating the second layer;
- a trench crossing the third and second layers and at least a portion of the thickness of the first layer, said trench laterally delimiting a contact metallization in the second layer; and
- in said trench, a metal spacer made of a material different from that of the second layer, in contact with the sides of the third and second layers.

BRIEF DESCRIPTION OF THE DRAWINGS

The foregoing and other features and advantages will be discussed in detail in the following non-limiting description of specific embodiments in connection with the accompanying drawings, in which.

DETAILED DESCRIPTION OF THE PRESENT EMBODIMENTS

Figure 1:
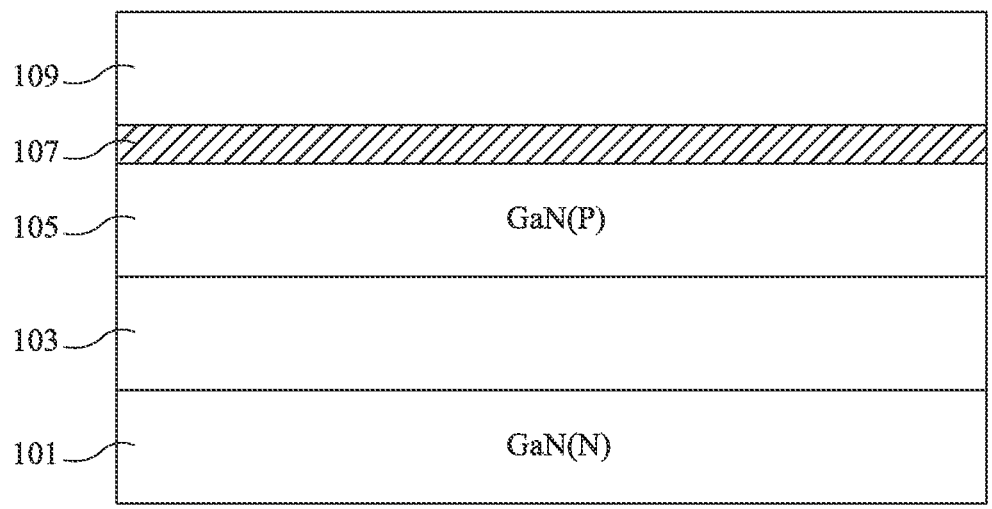
FIG. 1 schematically shows a step of an example of a method of manufacturing a semiconductor component according to an embodiment.

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the forming of a contact metallization arranged on top of and in contact with a semiconductor layer made of a III-N compound in a semiconductor compound is here more particularly considered. Only the steps and elements related to the forming of this metallization have been shown and are detailed.

Unless specified otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "rear", "top", "bottom", "left", "right", etc., or relative positions, such as terms "above", "under", "upper", "lower", "lateral", etc., or to terms qualifying directions, such as terms "horizontal", "vertical", etc., it is referred to the orientation of the drawings, it being understood that, in practice, the described structures may be oriented differently.

Unless specified otherwise, the expressions "around," "approximately," "substantially" and "in the order of" signify within 10%, and preferably within 5%.

In the present description, the terms III-N compound designates a composite semiconductor material comprising nitrogen (N), associated with one or a plurality of elements of column III of the periodic table of elements, for example, gallium (Ga), aluminum (Al), and/or indium (In). As an example, the term III-N compound here designates a semiconductor material from the group comprising gallium nitride (GaN), indium gallium nitride (InGaN), aluminum nitride (AlN), aluminum-gallium nitride (AlGaN), and indium gallium aluminum nitride (InGaAlN).

Conventionally, the manufacturing of a semiconductor component based on a III-N compound comprises the forming of a contact metallization on top of and in contact with the upper surface of a layer of the III-N compound, and the etching, from the upper surface of the layer of the III-N compound, of a peripheral trench extending vertically through at least a portion of the thickness of the layer of the III-N compound. The steps of forming of this contact metallization and of this peripheral trench are here mode particularly considered.

FIGS. 1 to 6 are partial simplified cross-section views illustrating successive steps of a method of manufacturing a semiconductor component based on a III-N compound. As an illustrative example, the forming of a gallium nitride light-emitting diode (LED) is here considered.

FIG. 1 shows an active LED stack comprising an N-type doped layer 101 made of gallium nitride (or any other III-N compound based on gallium nitride), an emissive layer 103 coating the upper surface of layer 101, for example, in contact with the upper surface of layer 101, and a P-type doped layer 105 made of gallium nitride (or any other III-N compound based on gallium nitride) coating the upper surface of layer 103, for example in contact with the upper surface of layer 103. Emissive layer 103 may comprise confinement means corresponding to multiple quantum wells. As an example, layer 103 comprises an alternation of semiconductor layers of a first III-N compound and of semiconductor layers of a second III-N compound, each layer of the first compound being sandwiched between two layers of the second compound, the first compound having a bandgap narrower than that of the second compound. In this example, layers 105 and 101 respectively form the anode region and the cathode region of the LED stack.

At this stage of the method, layers 101, 103, and 105 each continuously extend across a substantially uniform thickness, over the entire surface of the component.

The stack of layers 101, 103, and 105 may rest on a support substrate, not shown, for example made of sapphire, arranged on the lower surface side of layer 101. A buffer layer, not shown, may form an interface between the support substrate and the lower surface of layer 101. Layers 101, 103, and 105 are for example successively formed by epitaxy from the upper surface of the support substrate or of the buffer layer.

In practice, a plurality of LEDs may be simultaneously formed inside and on top of the active LED stack formed by layers 101, 103, and 105, for example to form a LED emissive micro-display. For simplification, the forming of a single LED is shown in FIGS. 1 to 6.

FIG. 1 more particularly illustrates a step of forming of a metal layer 107 on top of and in contact with the upper surface of layer 105. Layer 107 for example comprises aluminum or silver. In this example, layer 107 continuously extends across a substantially uniform thickness over the entire surface of layer 105. After the deposition of layer 107, to improve the quality of the electric contact between layer 107 and layer 105, an anneal of the structure may be provided, for example, at a temperature greater than or equal to 200° C. and smaller than the temperature of modification of the underlying epitaxial layers, for example, in the order of 900° C.

FIG. 1 further illustrates a step of deposition of a hard mask layer 109 on the upper surface of metal layer 107, for example in contact with the upper surface of metal layer 107, for subsequent steps of local etching of layer 107 and of at least a portion of the thickness of the stack formed by layers 101, 103, and 105. Hard mask layer 109 is for example a silicon oxide layer having a sufficiently large thickness to protect the underlying metal layer 107 during the subsequent etch steps. Hard mask layer 109 may be deposited after the possible anneal of metal layer 107, so that the anneal of layer 107 does not damage layer 109.

Figure 2:
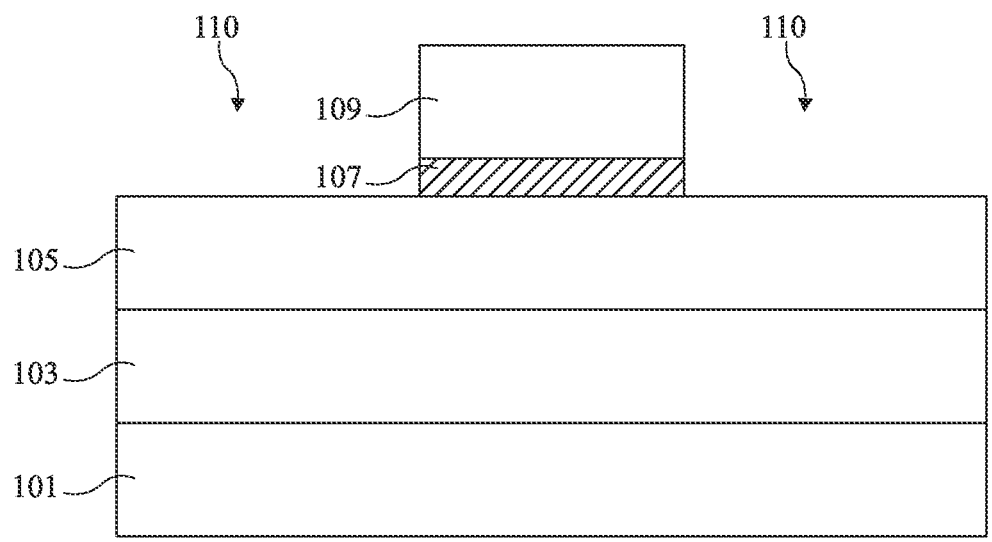
FIG. 2 schematically shows another step of an example of a method of manufacturing a semiconductor component according to an embodiment.

FIG. 2 illustrates a subsequent step (not detailed) of lithography and etching of hard mask layer 109 and of metal layer 107, according to an etch pattern which is a function of the component which is desired to be formed. In this example, during this step, layer 109 is removed from a peripheral region of the LED, after which metal layer 107 is etched in said peripheral region of the LED, to only keep a portion of metal layer 107 in a central region of the LED, said portion forming an anode contact metallization of the LED. In other words, in this example, a peripheral trench 110 extending vertically through layers 109 and 107 is formed from the upper surface of layer 109, trench 110 laterally delimiting, in layer 107, the anode contact metallization of the LED. In the shown example, the etching is interrupted on the upper surface of P-type layer 105, that is, when the upper surface of layer 105 is disengaged from the remainders of layer 107.

At the end of this first etching, the upper surface of anode contact metallization 107 remains protected by the overlying portion of hard mask layer 109. Conversely, the sides of anode contact metallization 107 are exposed. Thus, a problem which is posed is that anode contact metallization 107 risks being damaged during a subsequent step of etching, in the peripheral region of the LED, of at least a portion of the thickness of the stack formed by layers 101, 103, and 105 and, more specifically, during a step of chemical cleaning/etching of the walls of the etched of the stack of layers 101, 103, and 105.

Figure 3:
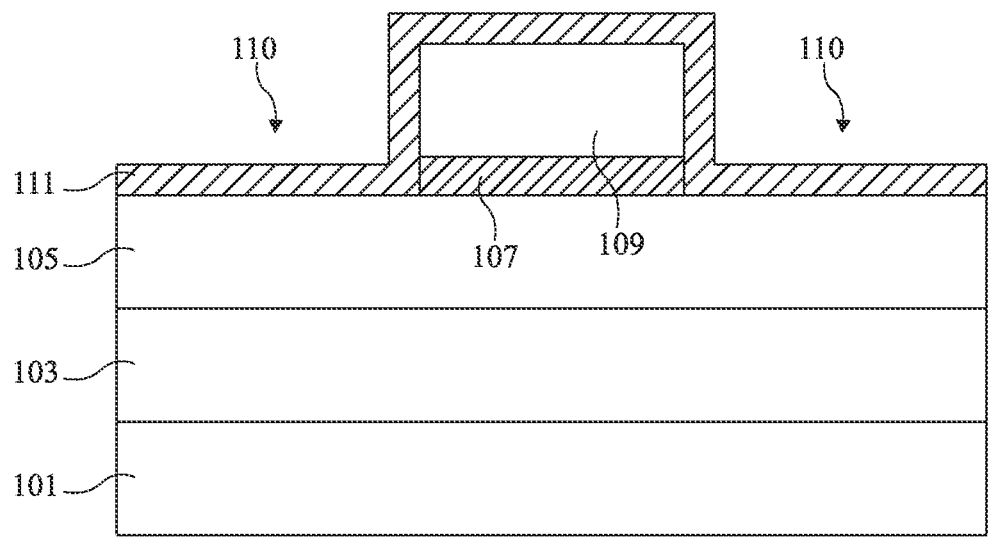
FIG. 3 schematically shows another step of an example of a method of manufacturing a semiconductor component according to an embodiment.

FIG. 3 illustrates a step of deposition of a metal layer 111 on the upper surface of the structure obtained at the end of the steps of FIGS. 1 and 2. Layer 111 is made of a metal different from that of the anode contact metallization 107 of the LED. More particularly, layer 111 is made of a metal having a rate of etching, by the chemical post-etching chemical cleaning solution subsequently used to clean the walls of the etched region of the stack of layers 101, 103, and 105 in the peripheral portion of the LED, smaller than that of the semiconductor materials of layers 101, 103, and 105. Preferably, the metal of layer 111 is selected to have a speed of etching by the post-etching chemical cleaning solution lower, for example, at least twice lower, than that of the metal of metallization 107. As an example, layer 111 is made of a metal from the group comprising platinum, nickel, and tungsten. Preferably, layer 111 is made of platinum.

Metal layer 111 is non-locally deposited (full plate), and thus continuously extends over substantially the entire upper surface of the structure obtained at the end of the steps of FIGS. 1 and 2. In particular, in this example, layer 111 extends on top of and in contact with the upper surface of layer 105 in the peripheral region of the LED (that is, at the bottom of peripheral trench 110), on top of and in contact with the sides of the non-etched central portions of layers 107 and 109 (that is, on the lateral walls of trench 110), and on top of and in contact with the upper surface of layer 109 in the central portion of the LED (outside of peripheral trench 110). Layer 111 may be deposited by a conformal deposition method to have a substantially uniform thickness over the entire surface of the structure. As an example, layer 111 is deposited by physical vapor deposition (PVD), for example, by means of a RF-DC plasma, or by chemical vapor deposition (CVD). The thickness of layer 111 is for example in the range from 10 nm to 1 µm.

Figure 4:
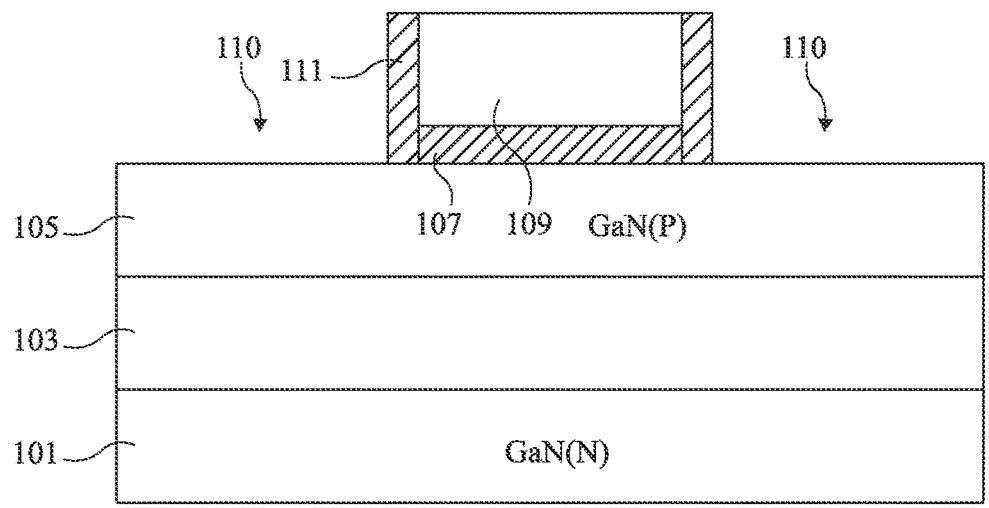
FIG. 4 schematically shows another step of an example of a method of manufacturing a semiconductor component according to an embodiment.

FIG. 4 illustrates a subsequent step of directional (or anisotropic) non-local (full plate) vertical etching of metal layer 111, to remove the horizontal portions and only keep the vertical portions of layer 111. The etching implemented during this step is for example an etching of IBE ("Ion Beam Etching") type or by ME-type ("Reactive Ion Etch") etching, or also by HD-RIE-type ("High-Density plasma Reactive Ion Etch," for example, based on ICP plasmas, microwave, or capacitive coupling) etching.

At the end of this step, only the vertical portions of layer 111 coating the sides of anode contact metallization 107 and of the overlying hard mask portion 109 (that is, the lateral walls of trench 110) are kept, forming metal spacers protecting the sides of anode contact metallization 107.

Figure 5:
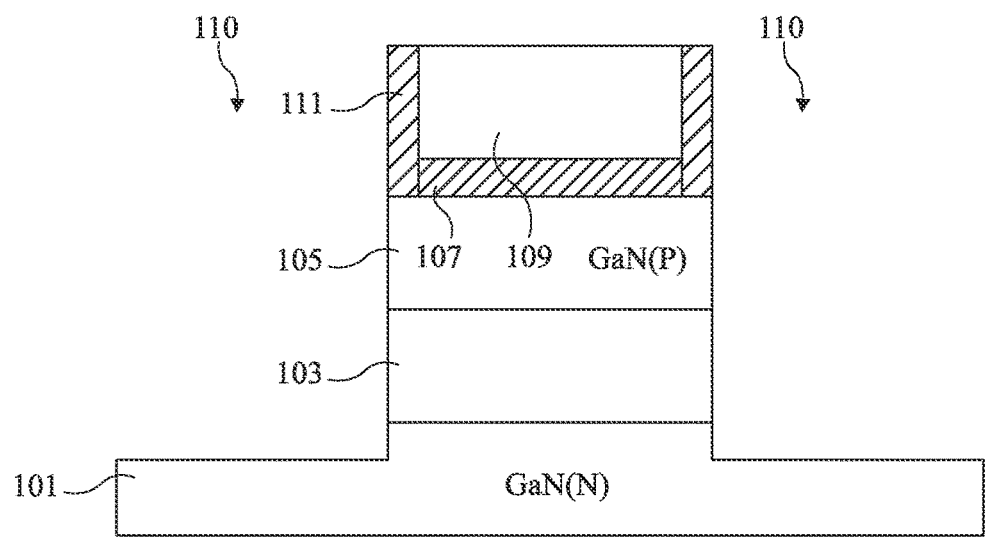
FIG. 5 schematically shows another step of an example of a method of manufacturing a semiconductor component according to an embodiment.

FIG. 5 illustrates a subsequent step of etching of at least a portion of the thickness of the stack formed by layers 101, 103, and 105 in the peripheral region of the LED, from the upper surface of the stack. In other words, during this step, peripheral trench 110 is vertically continued through at least a portion of the thickness of the stack formed by layers 101, 103, and 105. In this example, the etching thoroughly crosses anode layer 105 and emissive layer 103 and is interrupted at an intermediate level of cathode layer 101. The etching implemented during this step is a dry etching, for example, a plasma etching. Hard mask 109 enables to protect the central portion of the LED during the etching.

Figure 6:
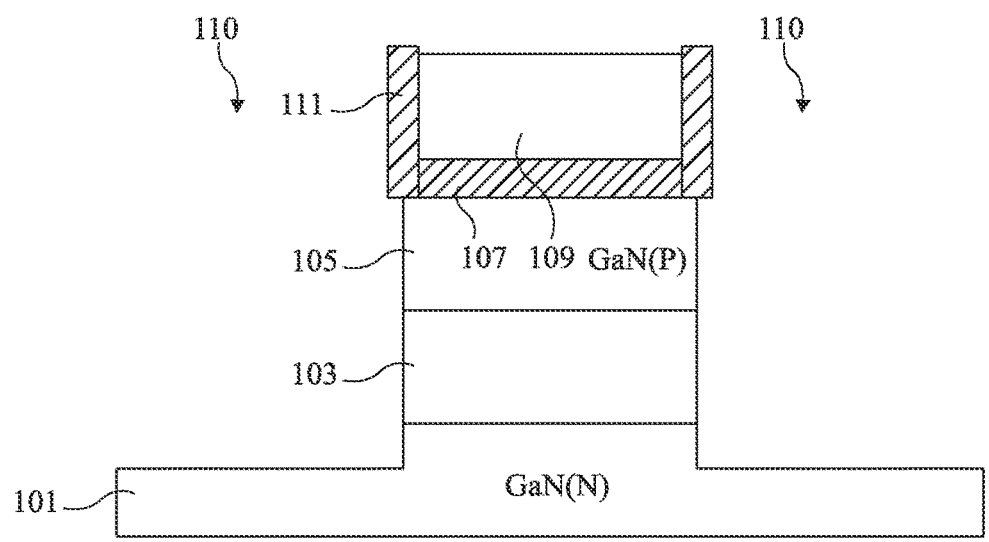
FIG. 6 schematically shows another step of an example of a method of manufacturing a semiconductor component according to an embodiment.

FIG. 6 illustrates a subsequent step of cleaning, by wet chemical etching, of the exposed surfaces of semiconductor layers 105, 103, and 101 inside of trench 110. This chemical cleaning step aims at removing the possible semiconductor portions damaged by the dry etching at the level of the lateral walls and of the bottom of trench 110, which would risk causing malfunctions of the LED.

The chemical solution used at this step may be a solution based on potassium hydroxide (KOH) or a solution based on tetramethylammonium hydroxide (TMAH) or a solution based on tetraethylammonium hydroxide (TEAH), or any other solution adapted to etching in controlled fashion the exposed surfaces of layers 101, 103, and 105.

As illustrated in FIG. 6, the chemical cleaning results in a slight recess of the materials of layers 101, 103, and 105 at the level of the lateral walls and of the bottom of trench 110, preferably across a thickness smaller than that of metal spacers 111, for example, across a thickness in the range from 5 to 300 nm. During this step, anode contact metallization 107 is laterally protected from the chemical etching solution by metal spacers 111.

The next steps (not detailed) of the method may correspond to usual steps of manufacturing of a gallium nitride LED.

Figure 7:
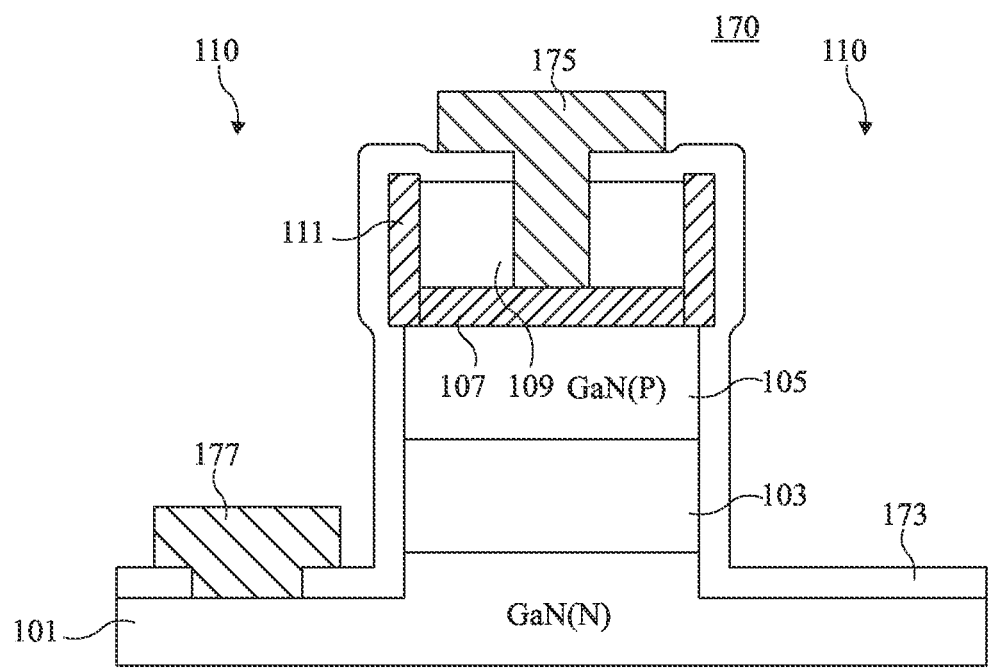
FIG. 7 schematically shows an example of a semiconductor component formed by the method of FIGS. 1 to 6.

FIG. 7 is a partial simplified cross-section view illustrating an example of a gallium nitride LED 170 capable of being obtained by such a method.

In this example, LED 170 comprises a passivation layer 173, for example, made of silicon oxide, substantially coating the entire surface of the structure obtained at the end of the steps of FIGS. 1 to 6. More particularly, in this example, passivation layer 173 covers the upper surface of layer 101 at the bottom of trenches 110, the sides of semiconductor layers 101, 103, and 105 and of metal spacers 111 at the level of the lateral walls of trenches 110, and the upper surface of spacers 111 and of layer 109 at the level of the central portion of the LED. Layer 173 is for example deposited over the entire upper surface of the structure obtained at the end of the steps of FIGS. 1 to 6, by a non-local deposition method (full plate).

LED 170 further comprises, at the level of its central portion, an anode connection metallization 175 extending in an opening formed in insulating layers 173 and 109, metallization 175 being in contact, by its lower surface, with the upper surface of metallization 107. LED 170 further comprises, at the level of its peripheral portion, a cathode connection metallization 177 extending in an opening formed in insulating layer 173, metallization 177 being in contact, by its lower surface, with the upper surface of semiconductor cathode region 101 remaining after the etching.

An advantage of the method described in relation with FIGS. 1 to 6 is that metal spacers 111 protect anode contact metallization 107 during the step of chemical cleaning of the exposed portions of semiconductor layer 101, 103, and 105 at the end of the step of etching of layers 101, 103, and 105. Thus, metallization 107 may be formed from as soon as the beginning of the method, which particularly enables to submit metallization 107 to an anneal enabling to improve the quality of the electric contact with layer 105. It should indeed be noted that if metallization 107 was formed at the end of the method, a high-temperature anneal of metal layer 107 would risk damaging the LED. Further, the metal of layer 107 may be selected with no specific precaution as to its chemical inertia properties, but rather by favoring its low-resistivity contact properties and/or its reflectivity properties.

The described embodiments are not limited to the specific example described hereabove where hard mask 109 is made of silicon oxide. As a variant, mask 109 may be made of metal, for example, of the same metal as spacers 111, for example, of platinum or of nickel.

More generally, this method may be adapted to the manufacturing of any semiconductor component based on a III-N compound, comprising a contact metallization on the upper surface of a layer of a III-N compound and requiring an etching of a peripheral trench extending across at least a portion of the thickness of the layer of the III-N compound.

Figure 8:
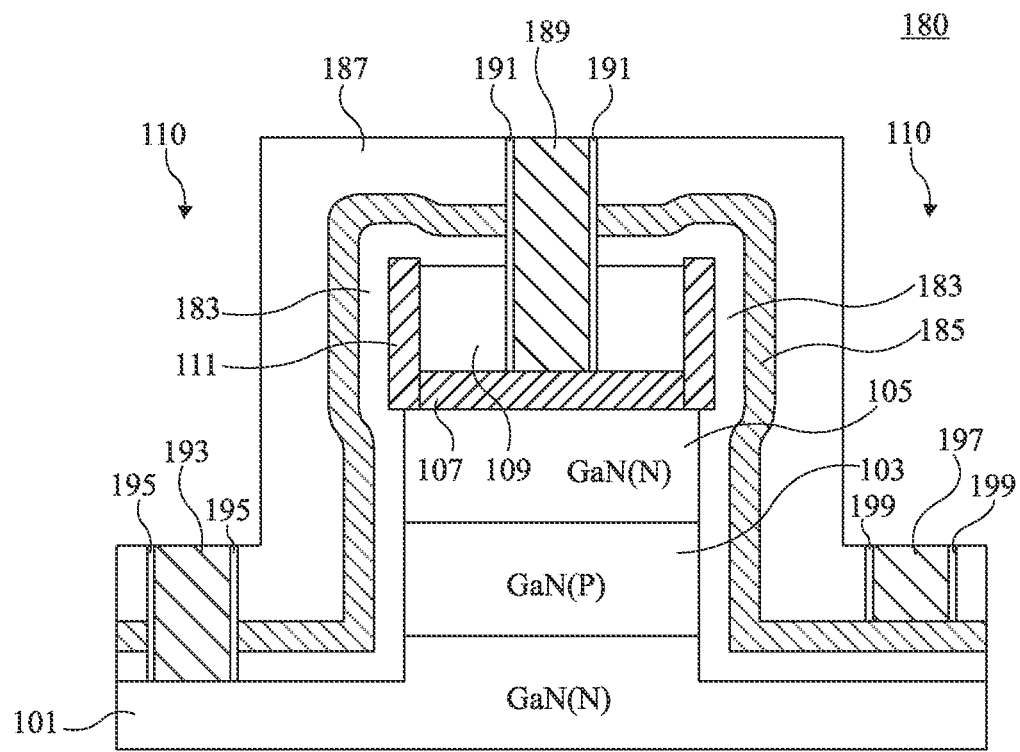
FIG. 8 schematically shows another example of a semiconductor component formed by the method of FIGS. 1 to 6.

FIG. 8 is a partial simplified cross-section view illustrating an example of a vertical gallium nitride MOS transistor 180 capable of being obtained by such a method. In this example, layer 101 is an N-type doped layer of gallium nitride (or any other III-N compound based on gallium nitride), layer 105 is an N-type doped layer of gallium nitride (or any other III-N compound based on gallium nitride), for example, substantially having the same doping level of layer 101, and layer 103 is a P-type doped layer of gallium nitride (or any other III-N compound based on gallium nitride) or an N-type doped layer of gallium nitride (or any other III-N compound based on gallium nitride) having a doping level smaller than that of layers 101 and 105.

In this example, transistor 180 comprises a gate insulator layer 183, for example, made of silicon oxide, coating substantially the entire surface of the structure obtained at the end of the steps of FIGS. 1 to 6. More particularly, in this example, gate insulator layer 183 covers the upper surface of layer 101 at the bottom of layers 110, the sides of semiconductor layers 101, 103, and 105 and of metal spacers 111 at the level of the lateral walls of trench 110, and the upper surface of spacers 111 and of layer 109 at the level of the central portion of the component. Gate insulator layer 183 is particularly in contact with the sides of the non-etched portion of semiconductor layer 103, which forms the channel-forming region of the transistor.

Transistor 180 further comprises a conductive gate layer 185, for example, a metal layer, coating substantially the entire upper surface of gate insulator layer 183.

Layers 183 and 185 are for example successively deposited over the entire surface of the structure, by a non-local conformal deposition method, at the end of the steps of FIGS. 1 to 6. As an example, layers 183 and 185 are deposited by a method of deposition in successive atomic layers, also called ALD ("Atomic Layer Deposition"), or by PECVD ("Plasma Enhanced Chemical Vapor Deposition").

Transistor 180 further comprises a passivation layer 187, for example, made of silicon oxide, substantially coating the entire surface of the structure obtained after the deposition of layers 183 and 185. Layer 187 is for example deposited by a non-local deposition method (full plate).

Transistor 180 further comprises, at the level of its central portion, a connection metallization 189 extending in an opening formed in layers 187, 185, 183, and 109, metallization 189 being in contact, by its lower surface, with the upper surface of metallization 107. Connection metallization 189 is laterally insulated from conductive gate layer 185 by spacers 191 made of an insulating material, for example, made of silicon oxide.

Transistor 180 further comprises, at the level of its peripheral region, a connection metallization 193 extending in an opening formed in layers 187, 185, and 183, metallization 193 being in contact, by its lower surface, with the upper surface of semiconductor layer 101. Connection metallization 193 is laterally insulated from conductive gate layer 185 by spacers 195 made of an insulating material, for example, silicon oxide.

Transistor 180 further comprises, at the level of its peripheral region, a connection metallization 197 extending in an opening formed in layer 187, metallization 197 being in contact, by its lower surface, with the upper surface of the conductive gate layer 185 of the transistor. In the shown example, connection metallization 197 is laterally separated from passivation layer 187 by spacers 199 made of an insulating material, for example, silicon oxide. This results from the fact that, in this example, the steps of forming of the openings, of forming of the spacers, and of filling of the openings with metal, are implemented simultaneously for each of the three metallizations 189, 193, and 197. As a variant, spacers 199 may be omitted.

In this example, metallizations 189, 193, and 197 respectively form first and second conduction terminals and a control terminal of transistor 180.

Various embodiments and variants have been described. It will be understood by those skilled in the art that certain features of these various embodiments and variants may be combined, and other variants will occur to those skilled in the art. In particular, the described embodiments are not limited to the above-described examples of semiconductor components, but more generally apply to the manufacturing of any semiconductor component comprising a portion of a layer of a III-N compound coated with a contact metallization and laterally delimited by a trench etched in said layer. As an example, the above-described method may apply to the forming of photosensitive diodes or of power diodes based on III-N compounds.

What is claimed is:

1. Method of manufacturing a semiconductor component, comprising the successive steps of:
   a) forming a stack comprising a first semiconductor layer made of a III-N compound, a second conductive layer coating the first semiconductor layer, and a third hard mask layer coating the second layer;
   b) forming a trench crossing the third hard mask layer and second conductive layer and stopping on the first semiconductor layer, said trench laterally delimiting a contact metallization in the second conductive layer;
   c) forming in said trench a metal spacer made of a material different from that of the second conductive layer, in contact with the sides of the third hard mask layer and the second conductive layer, wherein said forming comprises a step of deposition of a metal layer made of said material different from that of the second conductive layer on the upper surface of the third hard mask layer and on the lateral walls and at the bottom of said trench, then a step of vertical anisotropic etching of the metal layer, at the end of which only the vertical portions of the metal layer coating the lateral walls of said trench are kept; and
   d) continuing said trench through at least a portion of the thickness of the first semiconductor layer.

2. Method according to claim 1, further comprising, after step d), a step of chemical cleaning of the exposed surfaces of the first semiconductor layer inside of the trench.

3. Method according to claim 2, wherein the step of chemical cleaning is carried out by means of a solution based on potassium hydroxide or of a solution based on tetramethylammonium hydroxide, or of a solution based on tetraethylammonium hydroxide.

4. Method according to claim 1, wherein the second conductive layer comprises aluminum or silver.

5. Method according to claim 1, wherein the metal spacers are made of a metal from the group comprising platinum, nickel, and tungsten.

6. Method according to claim 1, wherein the etching implemented at step d) is a dry etching.

7. Method according to claim 1, further comprising, between step a) and step b), a step of anneal of the second conductive layer at a temperature in the range from 200° C. to 900° C.

8. Method according to claim 1, wherein the stack further comprises, on the side of the first semiconductor layer opposite to the second conductive layer, a third layer of a III-N compound different from that of the first semiconductor layer, and wherein the etching implemented at step d) thoroughly crosses the first semiconductor layer and at least a portion of the thickness of the third layer.

9. Method according to claim 8, wherein the stack further comprises, on the side of the third layer opposite to the first semiconductor layer, a fourth layer of a III-N compound different from that of the third layer, and wherein the etching implemented at step d) thoroughly crosses the third layer and at least a portion of the thickness of the fourth layer.

* * * * *